(12) United States Patent
Jang et al.

(10) Patent No.: US 7,659,185 B2
(45) Date of Patent: Feb. 9, 2010

(54) METHOD FOR FORMING SILICON THIN-FILM ON FLEXIBLE METAL SUBSTRATE

(75) Inventors: Jin Jang, Seoul (KR); Jong-Hyun Choi, Seoul (KR); Seung-Soo Kim, Seoul (KR); Jae-Hwan Oh, Seoul (KR); Jun-Hyuk Chon, Seoul (KR)

(73) Assignee: Kyunghee University Industrial & Academic Collaboration Foundation, Seoul (KR)

( * ) Notice: Subject to any disclaimer, the term of this patent is extended or adjusted under 35 U.S.C. 154(b) by 254 days.

(21) Appl. No.: 10/570,285

(22) PCT Filed: Sep. 2, 2004

(86) PCT No.: PCT/KR2004/002213

§ 371 (c)(1),
(2), (4) Date: Feb. 27, 2006

(87) PCT Pub. No.: WO2005/022619

PCT Pub. Date: Mar. 10, 2005

(65) Prior Publication Data

US 2006/0286780 A1 Dec. 21, 2006

(30) Foreign Application Priority Data

Sep. 2, 2003 (KR) ............ 10-2003-0061230
Jul. 20, 2004 (KR) ............ 10-2004-0056463

(51) Int. Cl.
*H01L 21/20* (2006.01)

(52) U.S. Cl. .......... 438/486; 438/482; 438/487; 438/799; 257/E21.094; 257/E29.296

(58) Field of Classification Search ............. 438/799, 438/482, 486, 487; 257/E29.296, E21.094
See application file for complete search history.

(56) References Cited

U.S. PATENT DOCUMENTS 3,657,613 A * 4/1972 Brody et al. .......... 257/66
5,851,860 A * 12/1998 Makita et al. ........ 438/166
5,976,989 A * 11/1999 Ishiguro .............. 438/758

(Continued)

FOREIGN PATENT DOCUMENTS

JP 2002-141284 5/2002

(Continued)

OTHER PUBLICATIONS

PCT/KR2004/002213 International Search Report Jan. 2004.

*Primary Examiner*—Matthew C Landau
*Assistant Examiner*—Vicki B Booker
(74) *Attorney, Agent, or Firm*—Daly, Crowley, Mofford & Durkee, LLP

(57) ABSTRACT

Disclosed are a method for forming a silicon thin-film on a substrate, and more particularly a method for forming a polycrystalline silicon thin-film of good quality on a flexible metal substrate. A metal substrate (110) is prepared and a surface of the metal substrate (110) is flattened. An insulation film (120) is formed on the metal substrate (110). An amorphous silicon layer (130) is formed on the insulation film (120). A metal layer (140) is formed on the amorphous silicon layer (130). A sample on the metal substrate (110) is heated and crystallized.

40 Claims, 6 Drawing Sheets

U.S. PATENT DOCUMENTS

| | | | |
|---|---|---|---|
| 6,558,986 B1 * | 5/2003 | Choi | 438/149 |
| 6,558,988 B1 * | 5/2003 | Suzuki et al. | 438/150 |
| 6,642,092 B1 * | 11/2003 | Voutsas et al. | 438/166 |
| 7,105,392 B2 * | 9/2006 | Isobe et al. | 438/166 |

FOREIGN PATENT DOCUMENTS

| | | |
|---|---|---|
| KR | 1999-0026441 | 4/1999 |
| KR | 1020020088221 A | 11/2002 |
| KR | 1020030060403 A | 7/2003 |

\* cited by examiner

Fig. 4
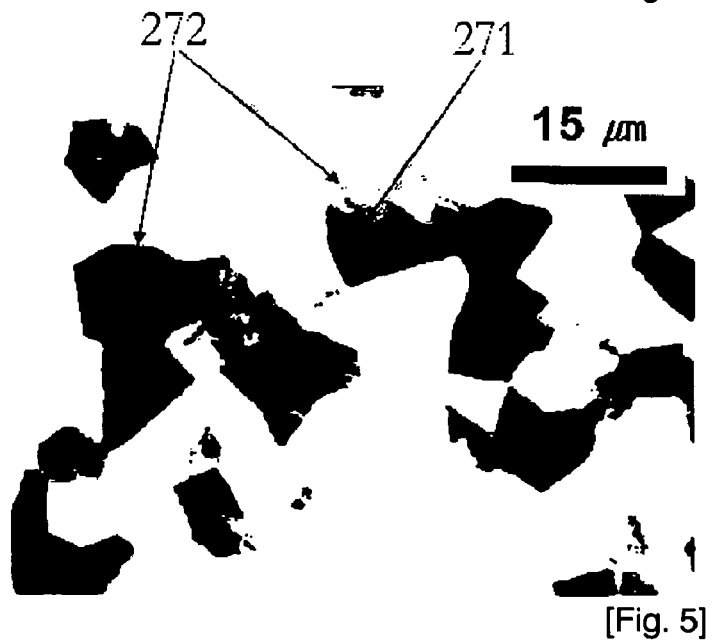
[Fig. 5]
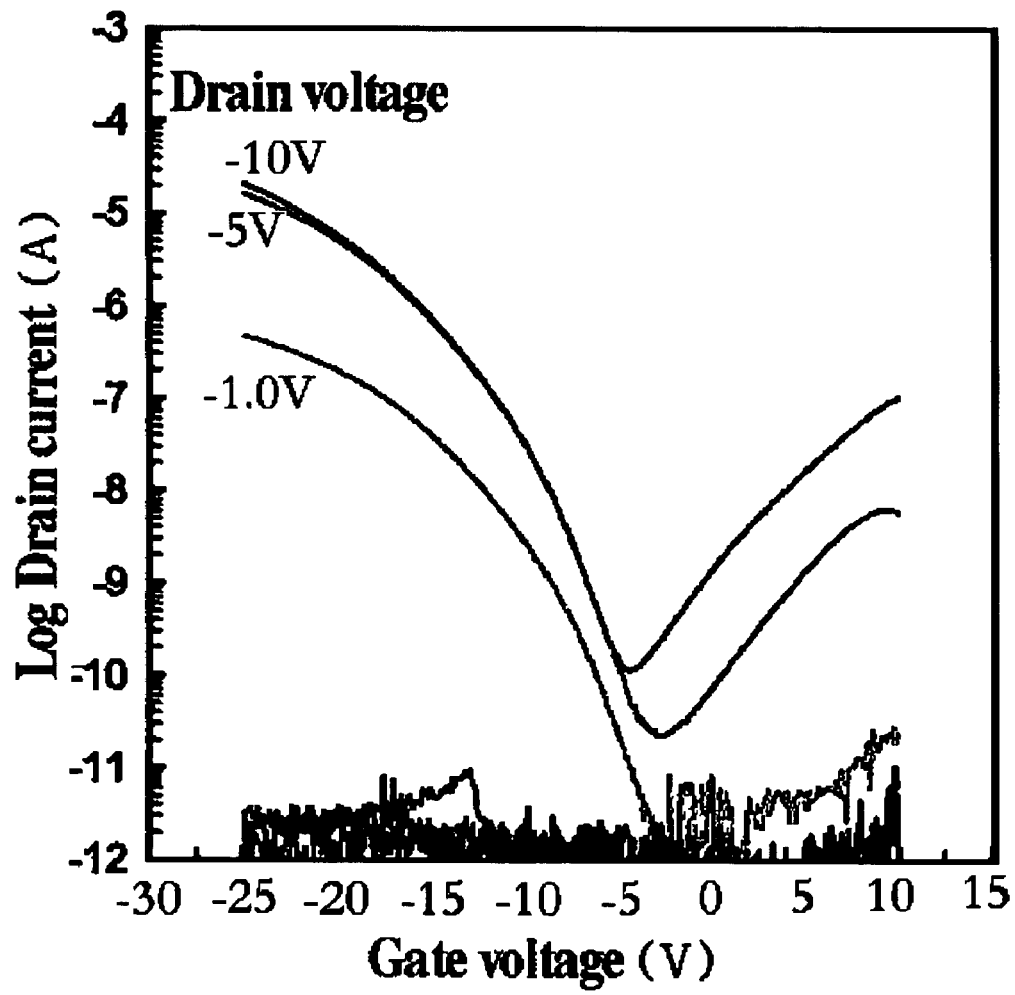

METHOD FOR FORMING SILICON THIN-FILM ON FLEXIBLE METAL SUBSTRATE

CROSS-REFERENCE TO RELATED APPLICATIONS

This application is a National Stage application under 35 U.S.C. § 371 of and claims the benefit of International Application No. PCT/KR2004/002213, filed on Sep. 2, 2004, published in the English language on Mar. 10, 2005 as International Publication Number WO 2005/022619 A1, which claims priority to Korean Application No. 10-2003-0061230, filed on Sep. 2, 2003 and Korean Application No. 10-2004-0056463, filed on Jul. 20, 2004, all of which are incorporated herein by reference.

TECHNICAL FIELD

The present invention relates to a method for forming a silicon thin-film on a substrate, and more particularly to a method for forming a polycrystalline silicon thin-film of good quality on a flexible metal substrate.

BACKGROUND ART

An active device of an AMLCD (Active Matrix Liquid Crystal Display), and a switching device and a peripheral circuit of an electro-luminescence device mostly use a polycrystalline silicon thin-film device.

A conventional method for converting an amorphous silicon film to a poly-crystalline silicon film uses high-temperature heat treatment and a laser.

The method for re-crystallizing the amorphous silicon film by means of laser beam radiation can perform a low-temperature process at 400° C. or less and manufacture a polycrystalline silicon thin-film in which field-effect mobility is high. However, it is difficult for the laser-based method to ensure uniformity of a crystallized sample when fabricating a large-area sample. There is a problem in that the laser-based method requires high-priced laser equipment, such that alternative technology is required.

The method using high-temperature heat treatment fabricates the polycrystalline silicon thin-film by means of a heat treatment process at a high temperature of 600° C. or more for a relatively long time. The method using high-temperature heat treatment necessarily requires a high crystallization temperature and a long heat treatment time. Because grains crystallized by the above-described method have many flaws, there is a difficulty in fabricating a device. Moreover, the method using high-temperature heat treatment has a problem in that a glass substrate cannot be used at a high crystallization temperature.

A crystallization method using metal has been recently proposed. The re-crystallization method using metal is a metal induced crystallization method and a metal induced lateral crystallization method. The crystallization method using metal can form a uniform thin-film in which a polycrystalline silicon thin-film transistor has high field-effect mobility. There is a problem in that a polycrystalline silicon thin-film fabricated by the re-crystallization method using metal has a limitation of electric characteristics due to a structure flaw within a thin film at a device manufacturing time. To address this problem, the re-crystallization method using metal requires a high-temperature heat treatment process at 800° C. or more or a re-crystallization process using a laser.

However, there is a problem in that the conventional method using a glass substrate cannot be used in a process at 600° C. or more and hence cannot perform a re-crystallization process at a high temperature.

DISCLOSURE OF INVENTION

Technical Solution

Therefore, the present invention has been made in view of the above and other problems, and it is one object of the present invention to provide a method for forming a polycrystalline silicon thin-film whose electric characteristics are excellent that can perform a re-crystallization process at a high temperature using a high-temperature heat treatment method serving as a simple re-crystallization method.

It is another object of the present invention to provide a method for forming a poly-crystalline silicon thin-film that can fabricate the polycrystalline silicon thin-film at low costs.

In accordance with a first aspect of the present invention, the above and other objects can be accomplished by the provision of a method for forming a silicon thin-film on a metal substrate, comprising the steps of:
  (a) preparing a metal substrate and flattening a surface of the metal substrate;
  (b) forming an insulation film on the metal substrate;
  (c) forming an amorphous silicon layer on the insulation film;
  (d) forming a metal layer on the amorphous silicon layer; and
  (e) heating and crystallizing a sample on the metal substrate.

In accordance with a second aspect of the present invention, the above and other objects can be accomplished by the provision of a method for forming a silicon thin-film on a metal substrate, comprising the steps of:
  (a) preparing a metal substrate and flattening a surface of the metal substrate;
  (b) forming a lower insulation film on the metal substrate;
  (c) forming amorphous silicon on the lower insulation film;
  (d) forming an upper insulation film on the amorphous silicon;
  (e) forming a metal layer on the upper insulation film; and
  (f) heating and crystallizing a sample on the metal substrate.

In accordance with a third aspect of the present invention, the above and other objects can be accomplished by the provision of a method for forming a silicon thin-film on a metal substrate, comprising the steps of:
  (a) preparing a metal substrate and flattening a surface of the metal substrate;
  (b) forming a lower insulation film on the metal substrate;
  (c) depositing and forming a metal layer on the lower insulation film;
  (d) forming amorphous silicon on the metal layer; and
  (e) heating and crystallizing a sample on the metal substrate.

The method for forming the silicon thin-film on the metal substrate will be described in detail step by step.

(a) Substrate Preparation Step

The purpose of this step is to prepare the metal substrate. It is preferred that the metal substrate is flexible stainless steel. In this case, a planarization process is carried out to flatten the metal substrate surface. The planarization process uses CMP (Chemical Mechanical Polishing). That is, the CMP is applied to the uneven topography of the metal substrate surface and flattens the metal substrate.

The metal substrate surface is covered by an insulation layer using a spin coating process and is flattened. In this case, as the insulation layer is formed on an uneven metal surface, the insulation layer is thickly formed on a relatively lower portion and is thinly formed on a relatively higher portion. Consequently, the substrate surface is entirely flattened. Of course, when this method is used, (b) Insulation film formation step to be described below is carried out along with the planarization process.

(b) Insulation Film Formation Step

The purpose of this step is to form the insulation film on the metal substrate prepared at (a) Substrate preparation step. The insulation film is formed by forming an oxide layer on the metal substrate. Moreover, the insulation film serves as a buffer layer. A method for forming the oxide layer serving as the insulation film on the metal substrate uses PECVD (Plasma Enhanced Chemical Vapor Deposition), sputtering, or an LPCVD (Low Pressure Chemical Vapor Deposition) process applied to the metal substrate to which a heat treatment process has been applied for a relatively long time of 30 minutes at a high temperature of 400° C. or more. When the heat treatment process is applied to the metal substrate at a temperature of 400° C. or more without a buffer layer, there is a problem in that the roughness of the metal surface is high. Thus, it is preferred that the first oxide film with a predetermined thickness is first formed on the metal substrate using the deposition process and then a pre-heat treatment process is carried out.

Thus, the insulation film formation step is divided into the step of forming the first oxide film on the metal substrate, the pre-heat treatment step and the step of forming the second oxide film.

It is preferred that the insulation film is formed not only on one surface of the metal substrate on which the amorphous silicon layer is formed, but also on the other surface of the metal substrate. The insulation film formed on the other surface of the metal substrate serves to protect the metal substrate surface, protects the metal substrate surface from chemicals when a predetermined process is applied to the substrate using chemicals after crystallization, and prevents chemicals from being contaminated when metal material is fused.

After the insulation film is formed, a second insulation film can be further formed on the insulation film. That is, a material such as a nitride film, an oxynitride, an oxide film or silicate (SOG (Spin-on-Glass)) is formed in one or more layers, such that characteristics of a device fabricated by the crystallization method of the present invention can be improved.

(c) Amorphous Silicon Thin-Film Formation Step

The purpose of this step is to form amorphous silicon on the insulation film. It is preferred that the amorphous silicon is formed by a deposition method and a layer of the amorphous silicon is formed in a thickness of 200~10000 Å. In this case, the amorphous silicon layer can be formed by means of one deposition process, and can be stacked and formed as multiple layers by multiple processes. When process conditions and material composition ratios are different even though the amorphous silicon layer is deposited using the same deposition process, a plurality of different layers can be formed. That is, when one layer is thinly formed using a different deposition process, for example, a sputter, and another layer is thickly formed using PECVD (Plasma Enhanced Chemical Vapor Deposition), the multiple layers can be formed. The amorphous silicon thin-film can be variously and differently formed according to a usage purpose of silicon.

(d) Metal Layer Formation Step

The purpose of this step is to thinly form the metal layer on the amorphous silicon.

It is preferred that the metal layer is formed by one of Ni, Co, Pd, Pt, Fe, Cu, Ag, Au, In, Sn, As, and Sb. In this case, the metal layer is formed by a CVD (Chemical Vapor Deposition) process or a metal plasma process using radio frequency power. At the subsequent crystallization step, the metal layer forms metal disilicide such as $NiSi_2$, serves as a nucleus for metal induction crystallization, and forms a grain laterally grown from the nucleus having a threshold value or more.

(e) Crystallization Step

The purpose of this step is to crystallize the amorphous silicon. A method for crystallizing the amorphous silicon uses a resistance heater, a halogen lamp, a UV (Ultraviolet) lamp, an electromagnetic induction heater or a laser.

The present invention is configured by the above-described 5 steps.

However, the present invention can further comprise the step of forming an upper insulation film between the amorphous silicon formation step and the metal layer formation step. Moreover, the present invention can further comprise a re-crystallization step after the crystallization step. In this case, the metal layer can be formed between the lower insulation film and the amorphous silicon layer.

The upper insulation film formation step is carried out by forming the upper insulation film on the amorphous silicon.

The amorphous silicon surface treatment step can be further carried out to apply a predetermined process to a surface of the amorphous silicon layer before the upper insulation film is formed. The amorphous silicon surface treatment step forms an oxide film by oxidizing the amorphous silicon surface by means of a cleaning process or a strong acid (e.g., HF) process for removing a natural oxide film generated on the amorphous silicon surface, such that the oxide film serves as a cover layer. Moreover, as an ozone process, a chemical process or a plasma process is applied to the amorphous silicon, device characteristics can be improved.

It is preferred that the upper insulation film is a silicon nitride film, or an oxynitride film. When the silicon nitride film is used as the insulation film, there is a merit in that an insulation film formation process is easy and a metal component can be easily diffused at the crystallization step. However, there is a problem in that the film may be damaged when being processed at a high temperature. The oxide film is not damaged when being processed at the high temperature, but there is a problem in that it is difficult for the metal component to be diffused. For this reason, the oxide film must be thinly formed in a thickness of 100 Å or less. The nitride or oxynitride film is most preferred in that insulation film formation and metal component diffusion are easy and the film is not damaged at a high-temperature process time.

The upper insulation film serves as a cover layer. Metal in the metal layer formed on the upper insulation film is diffused through the upper insulation film and a small amount of diffused metal forms a metal disilicide such as $NiSi_2$, serves as a nucleus for metal induction crystallization, and forms a grain laterally grown from the nucleus having a threshold value or more.

The purpose of the re-crystallization step is to carry out re-crystallization to improve electric characteristics of the crystallized silicon. In this case, the re-crystallization method is a method using laser beam radiation or heat treatment at a high temperature of 800° C. or more for a predetermined time period.

BRIEF DESCRIPTION OF THE DRAWINGS

The above and other objects, features and other advantages of the present invention will be more clearly understood from the following detailed description taken in conjunction with the accompanying drawings, in which:

FIG. 4 is a photomicrograph illustrating a polycrystalline silicon thin-film formed on a flexible metal substrate;

FIG. 5 is a graph illustrating transfer characteristics of a polycrystalline silicon thin-film transistor to which no re-crystallization step has been applied in accordance with the present invention;

MODE FOR THE INVENTION

Now, preferred embodiments of the present invention will be described in detail with reference to the annexed drawings.

Embodiment 1

Figure 1:
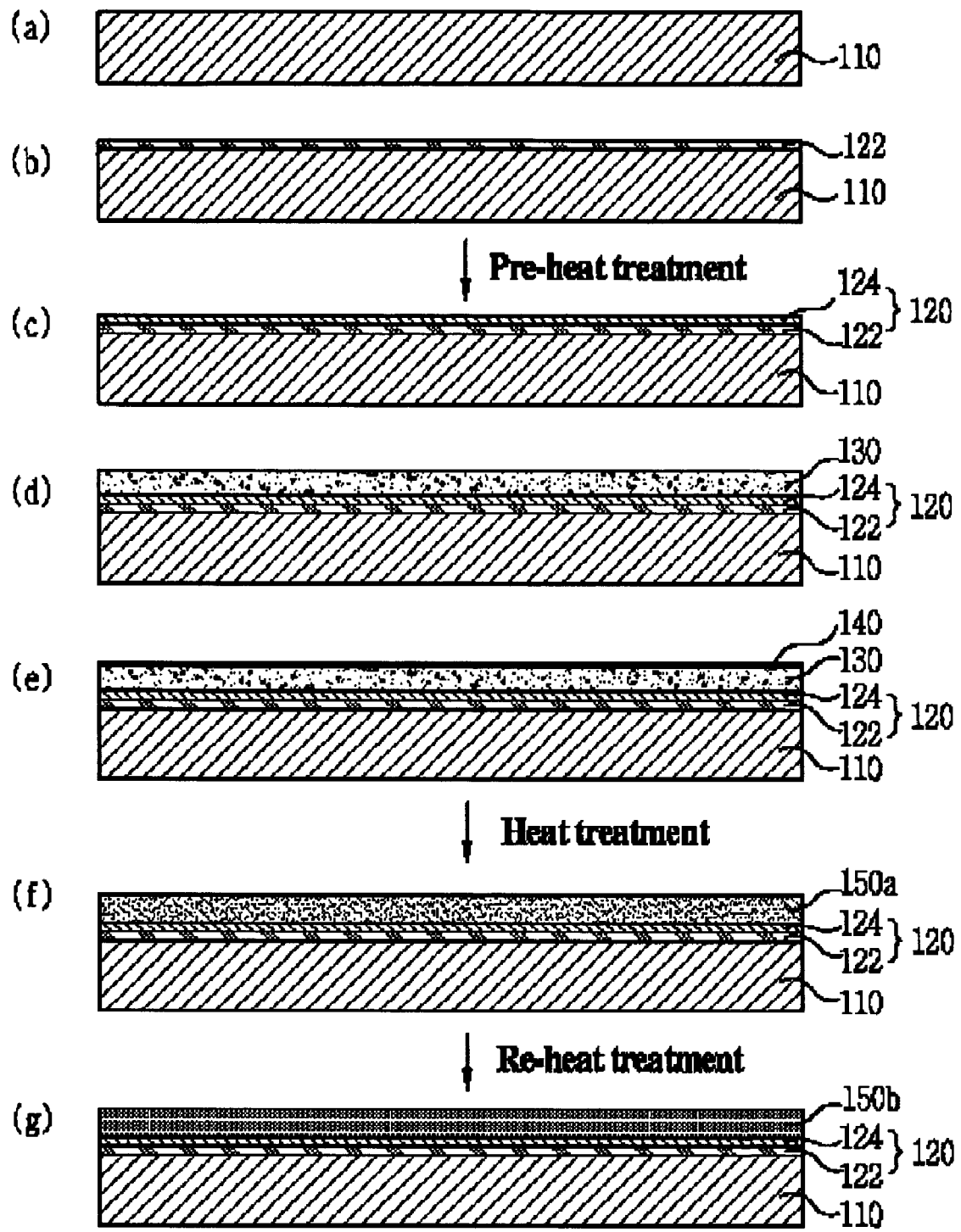
FIGS. 1(a) to 1(g) are process cross-sectional views illustrating a first embodiment of the present invention.

First, as shown in FIG. 1(a), a metal substrate 110 is prepared. It is preferred that the metal substrate 110 is flexible stainless metal. At this point, a planarization process is carried out so that the surface roughness of the metal substrate 110 is reduced to 200 Å or less. A method for flattening the metal substrate is a CMP (Chemical Mechanical Polishing) process. That is, the CMP process is applied to the uneven topography of a surface of the metal substrate 110.

Subsequently, as shown in FIG. 1(b), a first oxide film 122 with a thickness of 500~10000 Å is formed on the metal substrate 110.

When the first oxide film 122 has been formed, a pre-heat treatment process is applied to the metal substrate 110 for 30 minutes to 10 hours at a temperature of 400~1000° C. The above-described pre-heat treatment process removes impurities present within the metal substrate 110, prevents the surface of the metal substrate 110 from being oxidized and reduces the roughness of the surface of the metal substrate 110. Moreover, another purpose of the pre-heat treatment process is to form an oxide film on a rear surface of the metal substrate 110. That is, the first oxide film 122 is formed on both upper and lower surfaces or the upper surface of the metal substrate 110 in the process for forming the first oxide film 122.

As shown in FIG. 1(c), after cleaning the surface of the metal substrate 110 to which the pre-heat treatment process has been applied, a second oxide film 124 is formed on the first oxide film 122. The second oxide film 124 is formed in a thickness of 500~20000 Å. At this point, the second oxide film 124 serves as a buffer or insulation layer. Accordingly, the first and second oxide films 122 and 124 form an insulation film 120.

However, because the first oxide film 122 has been deposited on the metal substrate 110 in the pre-heat treatment process, the process for forming the second oxide film 124 can be committed. In this case, the first oxide film 122 only forms the insulation film 120.

Subsequently, as shown in FIG. 1(d), an amorphous silicon layer 130 is formed on the second oxide film 124 using a deposition process. At this point, the thickness of the amorphous silicon layer 130 is approximately 200~10000 Å. Moreover, the amorphous silicon layer 130 can be formed as at least two stacked layers.

As shown in FIG. 1(e), a Ni metal layer 140 is formed on the entire upper surface of the amorphous silicon layer 130 using a sputtering process. At this point, the Ni metal layer 140 is very thinly formed so that area density of atoms on the metal surface can be $10^{12}$~$10^{15}$ atoms/cm$^2$. Metal atoms of the metal layer 140 are used as a medium at a step for crystallizing the amorphous silicon. The metal layer 140 can be formed on the amorphous silicon layer 130 or can be formed between the second oxide film 124 and the amorphous silicon layer 130.

Subsequently, the heat treatment process is applied to the first and second oxide films 122 and 124, the amorphous silicon layer 130 and the metal layer 140 formed on the metal substrate 110, thereby crystallizing the amorphous silicon. In this embodiment, a high-temperature heat treatment method is used as a method for crystallizing the amorphous silicon. In this case, the heat treatment process is carried out at a temperature of 450~900° C., and a resistance heater, a halogen lamp, a UV (Ultraviolet) lamp or an electromagnetic induction heater can be used to generate heat. Alternatively, a laser can be used to generate heat. In a state in which an electric field or magnetic field operates, the heat treatment process can be carried out.

Finally, re-heat treatment process is carried out at a temperature of 800~1050° C. so that crystalline silicon 150a formed through the crystallization step can be re-crystallized. The laser beam can be irradiated to re-crystallize the crystalline silicon 150a. As shown in FIG. 1(g), re-crystallized silicon 150b is formed after the re-crystallization step. Because the present invention uses a metal substrate, there is a merit in that the re-crystallization process can be carried out at a temperature of 600° C. or more.

Embodiment 2

Figure 2:
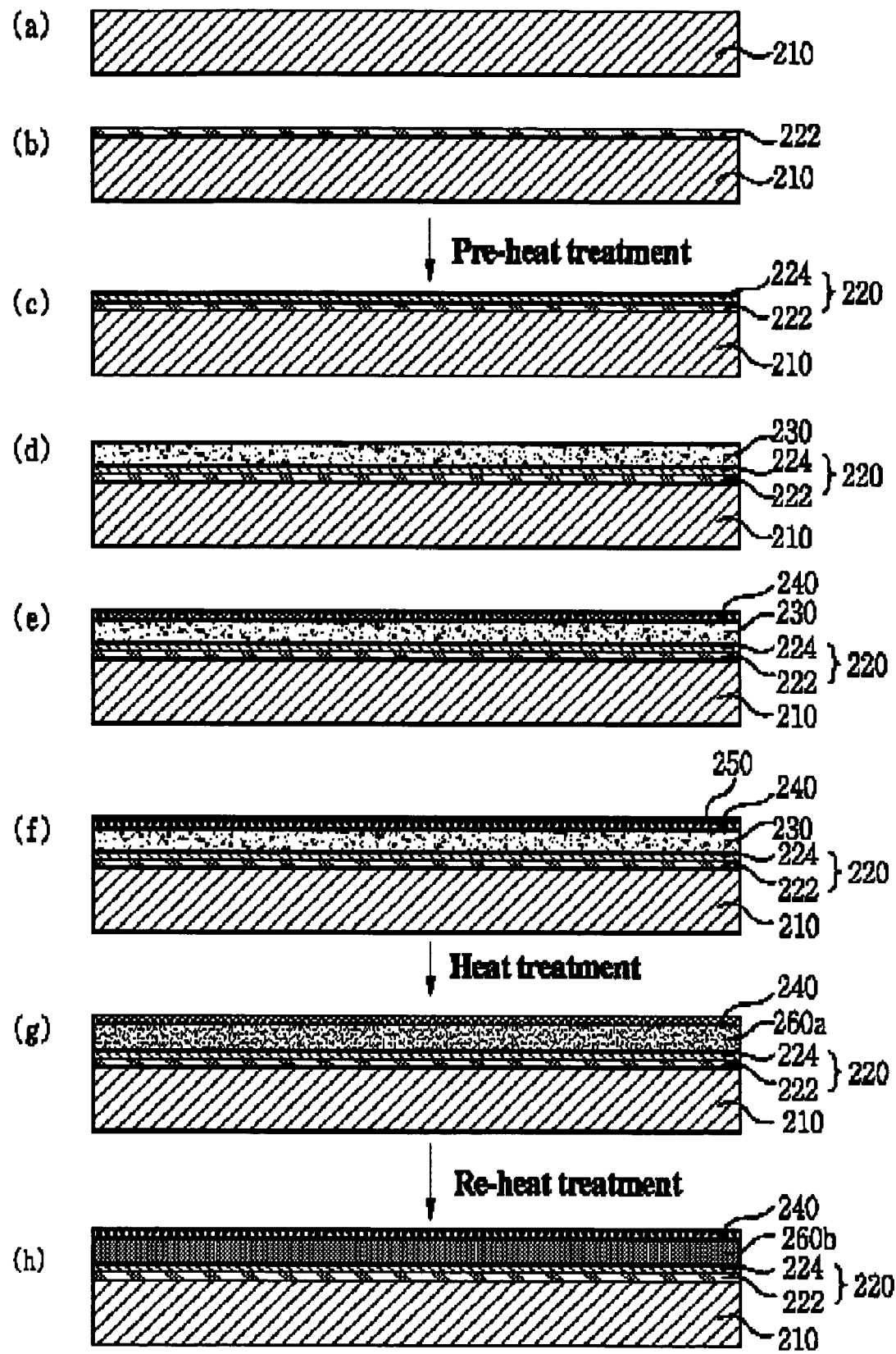
FIGS. 2(a) to 2(h) are process cross-sectional views illustrating a second embodiment of the present invention.

First, as shown in FIG. 2(a), a metal substrate 210 is prepared. It is preferred that the metal substrate 210 is flexible stainless metal. At this point, a planarization process is carried out so that the surface roughness of the metal substrate 210 is reduced to 200 Å or less. A method for flattening the metal substrate uses a CMP (Chemical Mechanical Polishing) process.

Subsequently, as shown in FIG. 2(b), a first oxide film 222 with a thickness of 500~10000 Å is formed on the metal substrate 210. When the first oxide film 222 has been formed, a pre-heat treatment process is applied to the metal substrate 210 for 30 minutes to 10 hours at a temperature of 400~1000° C. The above-described pre-heat treatment process serves to protect the surface of the metal substrate 210 and remove impurities present within the metal substrate 210.

As shown in FIG. 2(c), after cleaning the surface of the metal substrate 210 to which the pre-heat treatment process has been applied, a second oxide film 224 is formed on the first oxide film 222 using a deposition process. The second oxide film 224 is formed in a thickness of 500~20000 Å. At this point, the second oxide film 224 serves as a buffer or insulation layer. Accordingly, the first and second oxide films 222 and 224 form a lower insulation film 220.

However, because the first oxide film 222 has already been formed as in Embodiment 1, the process for forming the second oxide film 224 can be omitted. In this case, the first oxide film 222 only forms the lower insulation film 220.

Subsequently, as shown in FIG. 2(d), an amorphous silicon layer 230 is formed on the second oxide film 224 using a deposition process. At this point, it is preferred that a thickness of the amorphous silicon layer 230 is approximately 200~10000 Å. Of course, the amorphous silicon layer 230 can be formed as two or more stacked layers.

Subsequently, as shown in FIG. 2(e), a silicon nitride film is formed as a cover layer on the amorphous silicon layer 230. At this point, the silicon nitride film serves as an upper insulation film 240, and serves to increase the flatness of silicon to be crystallized by constantly passing through metal atoms in a metal layer 250 formed on the film 240. As the upper insulation film 240, an oxynitride film or an oxide film can be formed. It is preferred that the upper insulation film 240 is thinly formed in a thickness of approximately 0.1~100 Å.

Subsequently, as shown in FIG. 2(f), a Ni metal layer 250 is formed on the upper insulation film 240 using a sputtering process. At this point, the Ni metal layer 250 is formed so that area density of atoms on the metal surface can be $10^{12}$~$10^{16}$ atoms/cm$^2$. The area density on the metal surface in accordance with Embodiment 2 is greater than that on the metal surface in accordance with Embodiment 1. The reason for depositing the metal having the greater surface density in this embodiment as compared with Embodiment 1 is to easily control metal atoms because a larger number of metal atoms are passed and diffused through the upper insulation film 240 serving as the cover layer and also to protect a surface of a polycrystalline silicon thin-film to be formed later. The thinly formed metal layer can be removed along with the insulation film in a process for removing the insulation film and the metal layer after the crystallization step. Thus, there is a merit in that the insulation film and the metal layer can be removed in a single process after the crystallization step.

Subsequently, as shown in FIG. 2(g), re-heat treatment process is applied to the first and second oxide films 222 and 224, the amorphous silicon 230, the upper insulation film 240 and the metal layer 250 formed on the metal substrate 210, such that the amorphous silicon 230 is crystallized. As a method for crystallizing the amorphous silicon film in this embodiment, a high-temperature heat treatment method is used.

According to this method, a heat treatment process is carried out at a temperature of 630° C. for 30 minutes. At this point, a resistance heater, a halogen lamp, a UV (Ultraviolet) lamp or an electromagnetic induction heater can be used to generate heat.

Finally, as shown in FIG. 2(h), a heat treatment process is carried out at a temperature of 900° C. for 3 hours so that crystalline silicon 260a formed through the crystallization step can be re-crystallized. A laser beam can be irradiated to re-crystallize the crystalline silicon 260a. Because the present invention uses a metal substrate, there is a merit in that the high-temperature heat treatment process can be carried out at a temperature of 600° C. or more.

FIG. 4 is a photomicrograph illustrating a polycrystalline silicon thin-film 260b formed in accordance with this embodiment. In FIG. 4, the metal atoms from the metal layer are coupled with amorphous silicon, NiSi$_2$ serving as a nucleus of metal induction crystallization is generated, and a shape of a grain appears according to lateral growth from the nucleus. That is, it can be seen that a grain boundary 272 is formed as the laterally grown grain is in contact with a neighbor grain 271.

FIG. 5 is a graph illustrating transfer characteristics of a polycrystalline silicon thin-film transistor using a flexible metal substrate to which no re-crystallization step has been applied in accordance with the present invention. It can be seen that field-effect mobility and threshold voltage are 25.7 cm$^2$/Vs and −12 V, respectively, in FIG. 5. However, it can be seen that the threshold voltage is high and the amount of electric current is small in a switching-ON state.

Figure 6:
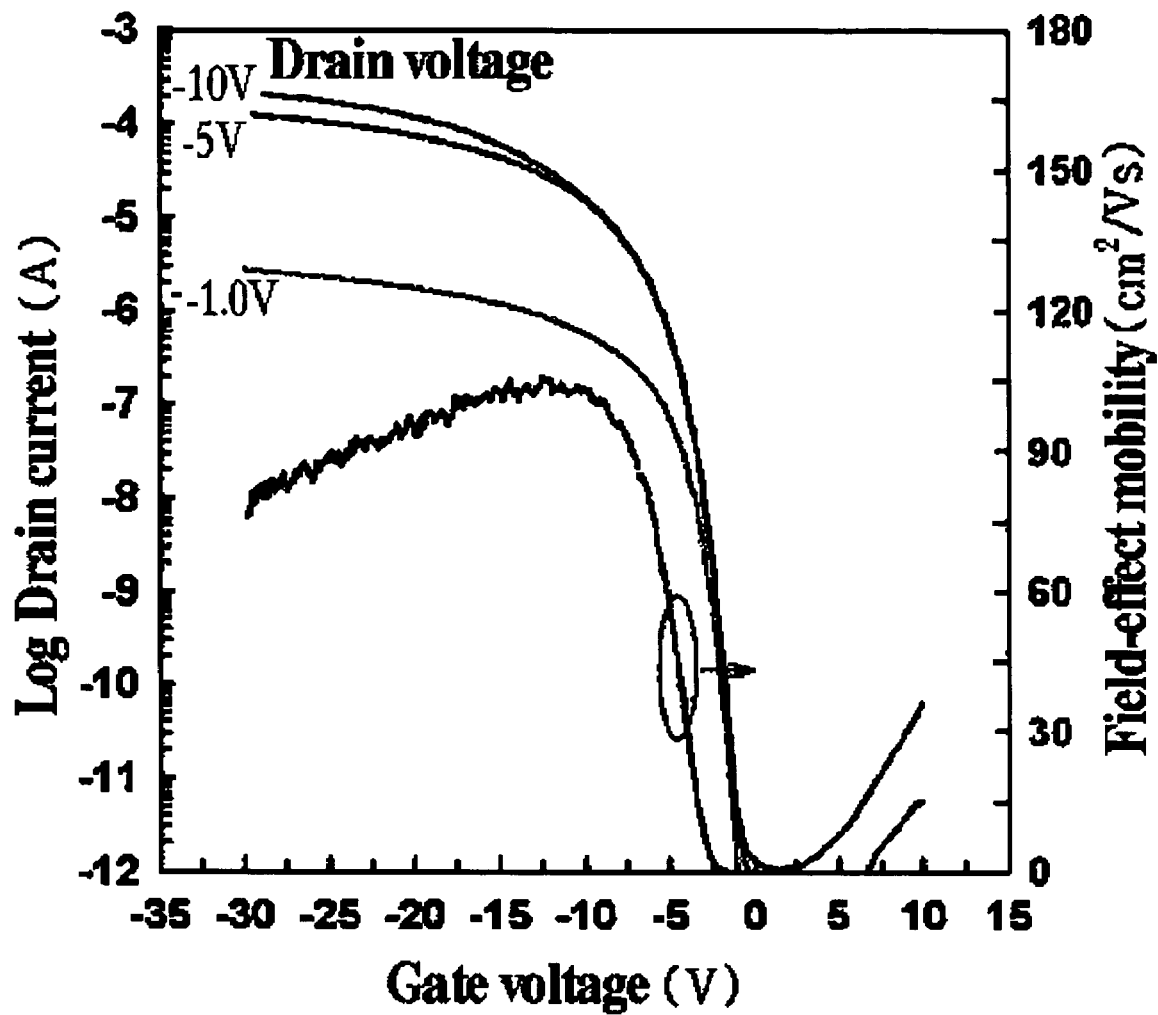
FIG. 6 is a graph illustrating transfer characteristics of a polycrystalline silicon thin-film transistor to which a re-crystallization step has been applied in accordance with the present invention.

FIG. 6 is a graph illustrating transfer characteristics of a polycrystalline silicon thin-film transistor using a flexible metal substrate to which a re-crystallization step has been applied in accordance with the present invention. It can be seen that field-effect mobility and threshold voltage are 104 cm$^2$/Vs and −3.6 V, respectively, in FIG. 6. That is, it can be seen that an amount of electric current in an ON state associated with the transfer characteristics in a thin-film transistor is relatively high and a gate voltage swing value is relatively small as compared with FIG. 5.

This means that crystallinity of the polycrystalline silicon thin-film is improved through the high-temperature heat treatment process, that is, the re-crystallization step. In this case, the gate voltage swing value is 0.48 V/dec.

Figure 7:
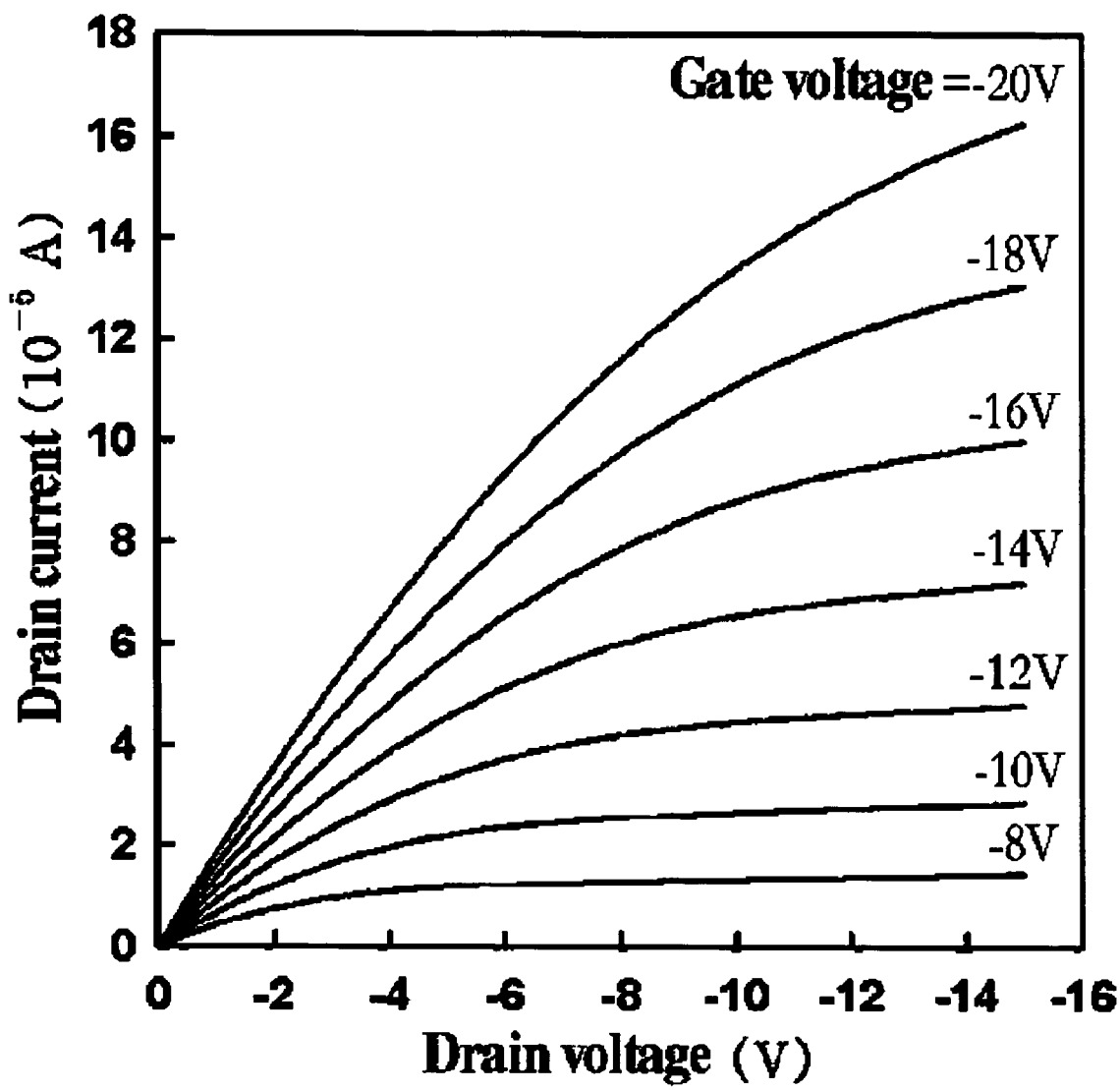
FIG. 7 is a graph illustrating output characteristics of the polycrystalline silicon thin-film transistor to which a re-crystallization step has been applied in accordance with the present invention.

FIG. 7 is a graph illustrating output characteristics of the polycrystalline silicon thin-film transistor using a flexible metal substrate to which a re-crystallization step has been applied in accordance with the present invention. It can be seen that the output characteristics of the thin-film transistor indicate good ohmic characteristics.

Embodiment 3

Figure 3:
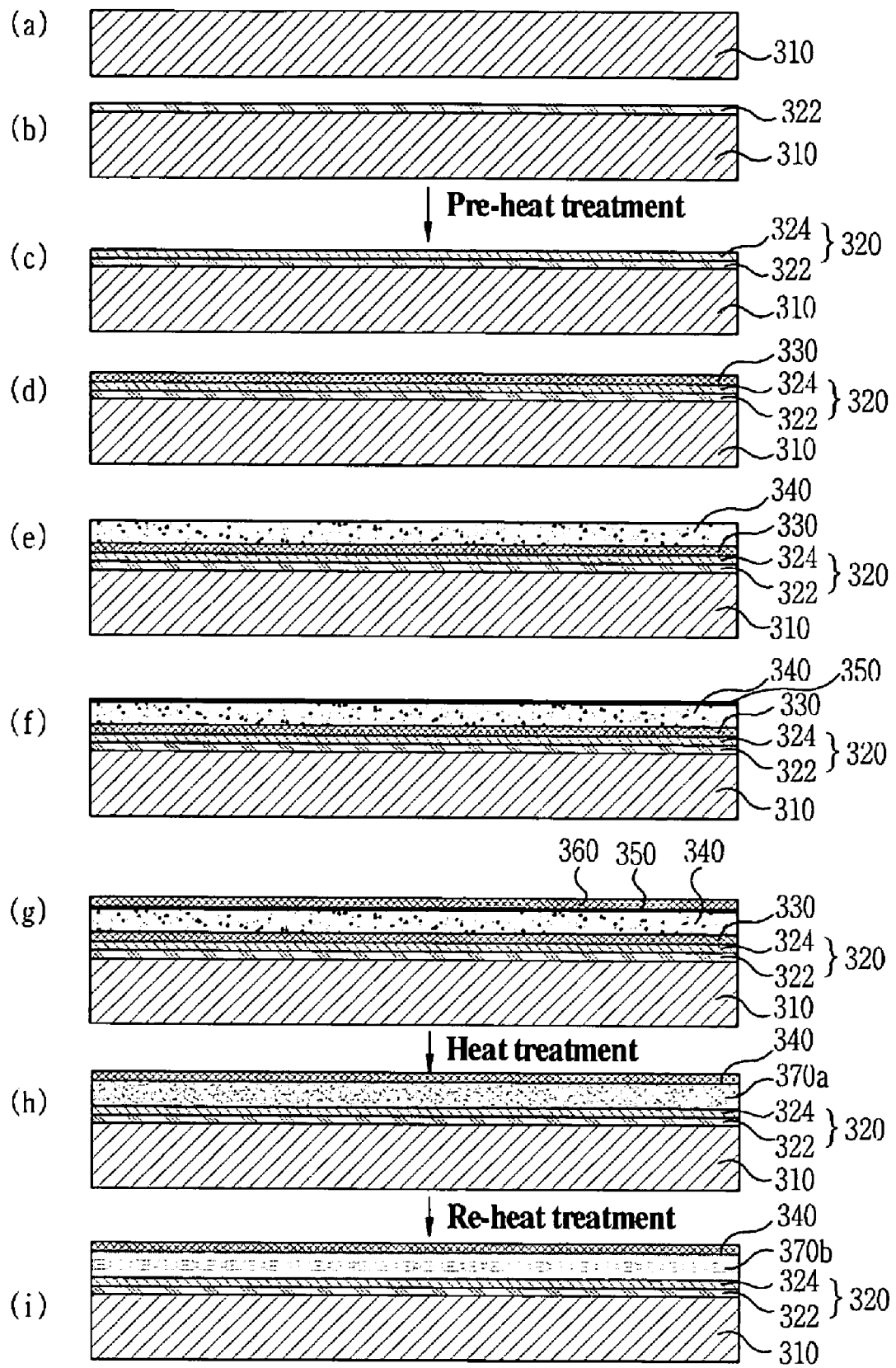
FIGS. 3(a) to 3(i) are process cross-sectional views illustrating a third embodiment of the present invention.

First, as shown in FIG. 3(a), a metal substrate 310 is prepared. It is preferred that the metal substrate 310 is flexible stainless metal. At this point, a planarization process is carried out so that the surface roughness of the metal substrate 310 is reduced to 200 Å or less. A method for flattening the metal substrate is a CMP (Chemical Mechanical Polishing) process.

Subsequently, as shown in FIG. 3(b), a first oxide film 322 with a thickness of 500~10000 Å is formed on the metal substrate 310. When the first oxide film 322 has been formed, a pre-heat treatment process is applied to the metal substrate 110 for 30 minutes to 10 hours at a temperature of 400~1000° C. The above-described pre-heat treatment process serves to protect the surface of the metal substrate 310 and remove impurities present within the metal substrate 310.

As shown in FIG. 3(c), after cleaning the surface of the metal substrate 310 to which the pre-heat treatment process has been applied, a second oxide film 324 is formed above the metal substrate 310 using a deposition process. The second oxide film 324 is formed in a thickness of 500~20000 Å. At this point, the second oxide film 324 serves as a buffer or insulation layer. Accordingly, the first and second oxide films 322 and 324 form a lower insulation film 320.

Because the first oxide film 322 has already been formed as in Embodiment 1, the process for forming the second oxide film 324 can be omitted. In this case, the first oxide film 322 only forms the lower insulation film 320.

Subsequently, as shown in FIG. 3(d), a Ni metal layer 330 is formed on the second oxide film 324 using a sputtering process. At this point, the Ni metal layer 330 is formed so that surface density of atoms on the metal surface can be $10^{12}$~$10^{16}$ atoms/cm$^2$. The surface density on the metal in accordance with Embodiment 3 is greater than that on the metal in accordance with Embodiment 1. The reason for depositing the metal having the greater surface density in this embodiment as compared with Embodiment 1 is to easily control metal atoms because a larger number of metal atoms are passed and diffused through the insulation film serving as the cover layer.

Subsequently, as shown in FIG. 3(e), an amorphous silicon layer 340 is formed on the metal layer 330 using a deposition process. At this point, it is preferred that a thickness of the amorphous silicon layer 340 is approximately 200~10000 Å. Moreover, the amorphous silicon layer 340 can be formed as two or more stacked layers.

Subsequently, as shown in FIG. 3(f), an upper insulation film 350 is formed on the amorphous silicon layer 340. The upper insulation film 350 is formed to prevent contamination of a surface of the amorphous silicon layer 340 and oxide film formation. It is preferred that the upper insulation film 350 is a silicon nitride film. Alternatively, the upper insulation film 350 can be an oxide nitride film or an oxide film.

Subsequently, as shown in FIG. 3(g), a second metal layer 360 is further formed on the upper insulation film 350. At this point, the metal layer 360 is formed for crystallization based on a medium of metal. It is preferred that the metal layer 360 is a Ni metal layer. The metal layer 360 is formed so that surface density of atoms on the metal layer 360 can be $10^{12}$~$10^{16}$ atoms/cm$^2$.

Subsequently, as shown in FIG. 3(h), a heat treatment process is applied to the first and second oxide films 322 and 324, the amorphous silicon film 340, the upper insulation film 350 and the first and second metal layers 330 and 360 formed on the metal substrate 310, such that amorphous silicon is crystallized. As a method for crystallizing the amorphous silicon in this embodiment, a high-temperature heat treatment method is used. According to this method, a heat treatment process is carried out at a temperature of 630° C. for 30 minutes. At this point, a resistance heater, a halogen lamp, a UV (Ultraviolet) lamp or an electromagnetic induction heater can be used to generate heat.

Finally, as shown in FIG. 3(i), re-heat treatment process is carried out at a temperature of 900° C. for 3 hours so that the crystalline silicon formed through the crystallization step can be re-crystallized. A laser beam can be irradiated to re-crystallize the crystalline silicon. Because the present invention uses a metal substrate as a substrate, there is a merit in that the high-temperature heat treatment process can be carried out at a temperature of 600° C. or more.

INDUSTRIAL APPLICABILITY

Because the present invention uses a high-temperature heat treatment method, a process for crystallizing amorphous silicon is simple and convenient.

Moreover, the crystallization method of the present invention is cost-effective because it does not use expensive laser equipment.

Moreover, because the present invention uses a metal substrate in place of a glass substrate, a high-temperature heat treatment process is possible and a polycrystalline silicon thin-film having electric characteristics of better quality can be formed through a re-crystallization step.

The invention claimed is:

1. A method for forming a silicon thin-film on a metal substrate, comprising the steps of:
   (a) preparing a metal substrate and flattening a surface of the metal substrate;
   (b) forming an insulation film on the metal substrate; wherein the step (b) comprises the steps of:
      (b-1) forming a first oxide film on the metal substrate;
      (b-2) applying a pre-heat treatment process to the metal substrate on which the first oxide film has been formed; and
      (b-3) forming a second oxide film on the first oxide film of the metal substrate to which the pre-heat treatment process has been applied;
   (c) forming an amorphous silicon layer on the insulation film;
   (d) forming a metal layer on the amorphous silicon layer; and
   (e) heating the insulation film, the amorphous silicon layer, and the metal layer formed on the metal substrate to crystallize the amorphous silicon layer.

2. The method of claim 1, wherein the metal substrate is configured by flexible metal.

3. The method of claim 1, wherein the step (a) comprises the step of:
   flattening the metal substrate surface by means of CMP (Chemical Mechanical Polishing).

4. The method of claim 1, wherein the step (a) comprises the step of:
   flattening the metal substrate surface and simultaneously forming the insulation film on the metal substrate by means of spin coating or deposition on one surface or both surfaces of the metal substrate.

5. The method of claim 1, wherein the step (c) comprises the step of:
   forming the amorphous silicon layer with a thickness of 200~10000 Å.

6. The method of claim 1, wherein the step (d) comprises the step of:
   forming the metal layer on which surface density is $10^{12}$~$10^{16}$ atoms/cm$^2$.

7. The method of claim 1, wherein the metal layer is formed by any one metal or an alloy of two metals selected from the group consisting of Ni, Co, Pd, Pt, Fe, Cu, Ag, Au, In, Sn, As, and Sb.

8. The method of claim 1, wherein the step (e) comprises the step of:
   carrying out crystallization at a temperature between 450° C. and 900° C.

9. The method of claim 1, wherein the step (e) comprises the step of:
   carrying out crystallization in a state in which an electric or magnetic field is applied to the amorphous silicon layer.

10. The method of claim 1, further comprising the step of:
    after the step (e) is performed, re-heating crystalline silicon formed on the metal substrate and re-crystallizing the crystalline silicon by carrying out a heat treatment process at a temperature between 700° C. and 1050° C.

11. The method of claim 1, wherein the insulation film is a multilayer stacked insulation film in which at least two layers are stacked based on one selected from among a nitride film, an oxynitride, an oxide film and silicate.

12. A method for forming a silicon thin-film on a metal substrate, comprising the steps of:
    (a) preparing a metal substrate and flattening a surface of the metal substrate;
    (b) forming a lower insulation film on the metal substrate; wherein the step (b) comprises the steps of:
       (b-1) forming a first oxide film on the metal substrate;
       (b-2) applying a pre-heat treatment process to the metal substrate on which the first oxide film has been formed; and
       (b-3) forming a second oxide film on the first oxide film of the metal substrate to which the pre-heat treatment process has been applied;
    (c) forming amorphous silicon on the lower insulation film;
    (d) forming an upper insulation film on the amorphous silicon;
    (e) forming a metal layer on the upper insulation film; and
    (f) heating the lower insulation film, the amorphous silicon, the upper insulation film, and the metal layer formed on the metal substrate to crystallize the amorphous silicon.

13. The method of claim 12, wherein the metal substrate is configured by flexible metal.

14. The method of claim 12, wherein the step (a) comprises the step of:
flattening the metal substrate surface by means of CMP (Chemical Mechanical Polishing).

15. The method of claim 12, wherein the step (a) comprises the step of:
flattening the metal substrate surface and simultaneously forming the insulation film on the metal substrate by means of spin coating or deposition on one surface or both surfaces of the metal substrate.

16. The method of claim 12, wherein the step (c) comprises the step of:
forming an amorphous silicon layer with a thickness of 200~10000 Å.

17. The method of claim 12, wherein the upper insulation film is a silicon nitride film or an oxynitride film with a thickness of 50~10000 Å.

18. The method of claim 12, further comprising the step of:
before the step (d) is performed, applying, to the amorphous silicon, a predetermined surface treatment process such as a strong acid process, plasma process or ozone process.

19. The method of claim 12, wherein the step (e) comprises the step of:
forming the metal layer on which surface density is $10^{12}$~$10^{16}$ atoms/cm$^2$.

20. The method of claim 12, wherein the metal layer is formed by any one metal or an alloy of two metals selected from the group consisting of Ni, Co, Pd, Pt, Fe, Cu, Ag, Au, In, Sn, As, and Sb.

21. The method of claim 12, wherein the step (f) comprises the step of:
carrying out crystallization at a temperature between 450° C. and 900° C.

22. The method of claim 12, wherein the step (f) comprises the step of:
carrying out crystallization in a state in which an electric or magnetic field is applied to the amorphous silicon.

23. The method of claim 12, further comprising the step of:
after the step (f) is performed, re-heating crystalline silicon formed on the metal substrate and re-crystallizing the crystalline silicon by carrying out a heat treatment process at a temperature between 700° C. and 1050° C.

24. The method of claim 12, wherein the lower insulation film is a multilayer stacked insulation film in which at least two layers are stacked based on one selected from among a nitride film, an oxynitride and silicate.

25. The method of claim 12, further comprising the step of:
after the step (f) is performed, simultaneously removing the metal layer and the upper insulation film.

26. A method for forming a silicon thin-film on a metal substrate, comprising the steps of:
(a) preparing a metal substrate and flattening a surface of the metal substrate;
(b) forming a lower insulation film on the metal substrate; wherein the step (b) comprises the steps of:
(b-1) forming a first oxide film on the metal substrate;
(b-2) applying a pre-heat treatment process to the metal substrate on which the first oxide film has been formed; and
(b-3) forming a second oxide film on the first oxide film of the metal substrate to which the pre-heat treatment process has been applied;
(c) depositing and forming a metal layer on the lower insulation film;
(d) forming amorphous silicon on the metal layer; and
(e) heating the lower insulation film, the metal layer, and the amorphous silicon formed on the metal substrate to crystallize the amorphous silicon.

27. The method of claim 26, further comprising the step of:
forming an upper insulation film on the amorphous silicon.

28. The method of claim 27, further comprising the step of:
forming a second metal layer on the upper insulation film.

29. The method of claim 26, wherein the metal substrate is configured by flexible metal.

30. The method of claim 26, further comprising the step of:
after the step (c) is performed, forming another insulation film (corresponding to any one selected from a silicon nitride, an oxynitride and an oxide film) on the metal layer.

31. The method of claim 26, wherein the step (a) comprises the step of:
flattening the metal substrate surface by means of CMP (Chemical Mechanical Polishing).

32. The method of claim 26, wherein the step (a) comprises the step of:
flattening the metal substrate surface and simultaneously forming the insulation film on the metal substrate by means of spin coating or deposition on one surface or both surfaces of the metal substrate.

33. The method of claim 26, wherein the step (d) comprises the step of:
forming an amorphous silicon layer with a thickness of 200~10000 Å.

34. The method of claim 27, wherein the upper insulation film is any one selected from a silicon nitride film, an oxynitride film and an oxide film.

35. The method of claim 27, further comprising the step of:
before the upper insulation film is formed, applying a predetermined surface treatment process such as plasma treatment, wet chemical treatment, or ozone treatment to the amorphous silicon.

36. The method of claim 35, wherein the step (e) comprises the step of:
forming the metal layer on which surface density is $10^{12}$~$10^{16}$ atoms/cm$^2$.

37. The method of claim 35, wherein the metal layer is formed by any one metal or an alloy of two metals selected from the group consisting of Ni, Co, Pd, Pt, Fe, Cu, Ag, Au, In, Sn, As, and Sb.

38. The method of claim 35, wherein the step (e) uses any one selected from among a resistance heater, a halogen lamp, a UV (Ultraviolet) lamp, an electromagnetic induction heater and a laser as a heat source for crystallizing the amorphous silicon.

39. The method of claim 35, wherein the step (e) comprises the step of:
carrying out crystallization in a state in which an electric or magnetic field is applied to the amorphous silicon.

40. The method of claim 35, further comprising the step of:
after the step (e) is performed, re-heating crystalline silicon formed on the metal substrate and re-crystallizing the crystalline silicon by carrying out a heat treatment process at a process between 700 and 1050° C.

* * * * *